(12) United States Patent
Camarota

(10) Patent No.: US 7,505,331 B1
(45) Date of Patent: Mar. 17, 2009

(54) PROGRAMMABLE LOGIC DEVICE WITH DIFFERENTIAL COMMUNICATIONS SUPPORT

(75) Inventor: Rafael Czernek Camarota, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 328 days.

(21) Appl. No.: 11/286,165

(22) Filed: Nov. 23, 2005

(51) Int. Cl.
*G11C 7/10* (2006.01)

(52) U.S. Cl. .................... 365/189.08; 326/38; 365/191; 365/198

(58) Field of Classification Search .............. 326/16, 326/39, 40, 41, 38; 714/725; 365/189.08, 365/189.17, 201, 191, 198
See application file for complete search history.

(56) References Cited

U.S. PATENT DOCUMENTS

| | | | |
|---|---|---|---|
| 6,243,842 B1 * | 6/2001 | Slezak et al. | 714/724 |
| 6,553,523 B1 * | 4/2003 | Lindholm et al. | 714/725 |
| 6,983,441 B2 * | 1/2006 | Wescott | 716/17 |
| 7,210,081 B1 * | 4/2007 | Euzent et al. | 714/725 |
| 7,298,646 B1 * | 11/2007 | Turner | 365/185.01 |
| 7,302,562 B1 * | 11/2007 | Jacobson et al. | 713/100 |
| 7,313,730 B1 * | 12/2007 | Ryser | 714/30 |
| 7,363,545 B1 * | 4/2008 | Jacobson et al. | 714/39 |

OTHER PUBLICATIONS

"FTDI Chip—FT245BM USB FIFO (USB—Parallel) I.C.; DS245B Version 1.4" Data Sheet of Future Technology Devices Intl. Ltd (2004) pp. 1-24.

"GL603USB; GL603USB-A; GL603USB-B; USB+ PS/2 Mouse Microcontroller; Specification 1.4" Data Sheet of Genesys Logic, Inc., Sep. 22, 2000; pp. 1-41.

"GL800USB USB2.0 UTMI Compliant Transceiver; Specification 1.2" Aug. 20, 2002 Data Sheet of Genesys Logic, Inc., pp. 1-24.

"MasterBlaster Serial/USB Communications Cable User Guide"; User Guide of Altera Corporation, Jul. 2004, pp. i-viii; pp. 1-1 to 1-6, and pp. 2-1 to 2-8.

"USB-Blaster Download Cable User Guide"; User Guide of Altera Corporation, Dec. 2004, pp. i-iv; p. 1-1 to 1-6, and pp. 2.1 to 2-8.

* cited by examiner

*Primary Examiner*—VanThu Nguyen
*Assistant Examiner*—Alexander Sofocleous
(74) *Attorney, Agent, or Firm*—Treyz Law Group; G. Victor Treyz

(57) ABSTRACT

Programmable logic device integrated circuits with differential communications circuitry are provided in which the differential communications circuitry is used to support programming, testing, and user mode operations. Programming operations may be performed on a programmable logic device integrated circuit by receiving configuration data with the differential communications circuitry and storing the received configuration data in nonvolatile memory. The nonvolatile memory may be located in an external integrated circuit such as a configuration device or may be part of the programmable logic device integrated circuit. The stored configuration data may be loaded into configuration memory in the programmable logic device to program the device to perform a desired custom logic function. The differential communications circuitry may be used to handle boundary scan tests and programmable scan chain tests. During user mode operations the differential communications circuitry carries user data traffic.

12 Claims, 17 Drawing Sheets

PROGRAMMABLE LOGIC DEVICE WITH DIFFERENTIAL COMMUNICATIONS SUPPORT

BACKGROUND

This invention relates to programmable logic devices, and more particularly, to programmable logic devices with differential communications circuitry that can be used during device programming, testing, and normal in-system operation.

Programmable logic devices are a type of integrated circuit that can be programmed by a user to implement a desired custom logic function. In a typical scenario, a logic designer uses computer-aided design (CAD) tools to design a custom logic circuit. The CAD tools help the designer implement the custom logic circuit using available programmable logic device resources. The CAD tools generate configuration data. When the configuration data is loaded into a programmable logic device, the programmable logic device performs the functions of the custom logic circuit.

Programmable logic devices are typically programmed and tested using procedures that are compliant with JTAG (Joint Test Action Group) standards promulgated by the Institute of Electrical and Electronics Engineers (IEEE). Programmable logic devices have JTAG ports that are connected to 10-pin JTAG connectors on system boards. A JTAG cable can be connected between JTAG-compliant equipment and the JTAG connector. This type of arrangement may be used to load configuration data on a programmable logic device and may be used to perform boundary scan testing. The JTAG port may also be used to support other functions such as manufacturing diagnostics and real-time design diagnostics.

Although use of the JTAG standard to support these types of operations has become widespread, the JTAG standard is not as robust as other standards and supports only relatively low data rates. Moreover, JTAG ports are generally not used once a programmable logic device is operating normally in a system. Normal system use, which is sometimes referred to as "user mode" operation, relies on other types of ports and does not involve JTAG communications. As a result, the JTAG 10-pin connector and the JTAG circuitry on JTAG-compliant programmable logic devices represent undesirable system overhead.

What is therefore needed is a way to support programming, testing, and user mode operations more effectively.

SUMMARY

Programmable logic device integrated circuits are provided with differential communications circuitry such as universal serial bus (USB) communications circuitry. The differential communications circuitry is used during device programming. The programmable logic device contains configuration memory and programmable logic. When configuration data is loaded into the configuration memory, the configuration memory produces corresponding static control signals that configure the programmable logic to implement a desired logic function.

With one suitable arrangement, the programmable logic device configuration memory is based on volatile memory cells that are loaded with configuration data from nonvolatile memory. The nonvolatile memory may be on an external integrated circuit such as a configuration device or may be provided as part of the programmable logic device integrated circuit. During programming, the differential communications circuitry receives the configuration data from a programmer or other external equipment and stores the configuration data in the nonvolatile memory. Subsequently, the configuration data is transferred from the nonvolatile memory to the configuration memory.

Boundary scan testing and programmable scan chain testing may be performed using the differential communications circuitry.

During normal use in a system, the programmable logic device uses the same differential communications circuitry to carry user data traffic.

The differential communications circuitry can support high data rates with good noise immunity and obviates the need for duplicative legacy programming and testing ports in devices in which differential communications capabilities are desired to support user mode operations.

Further features of the invention, its nature and various advantages will be more apparent from the accompanying drawings and the following detailed description of the preferred embodiments.

DETAILED DESCRIPTION

The present invention relates to integrated circuits that have circuitry that can be programmed by a user. Circuits of this type are typically referred to as programmable logic devices. The invention also relates to methods for programming, testing, and using programmable logic devices.

Programmable logic devices are integrated circuits that can be configured by a user (e.g., a logic designer) to perform custom logic functions. Electrically-programmed programmable logic devices are programmed by loading configuration data into the device. The configuration data selectively turns on and off components of the device's circuitry and thereby customizes the logic on the device.

Figure 1:
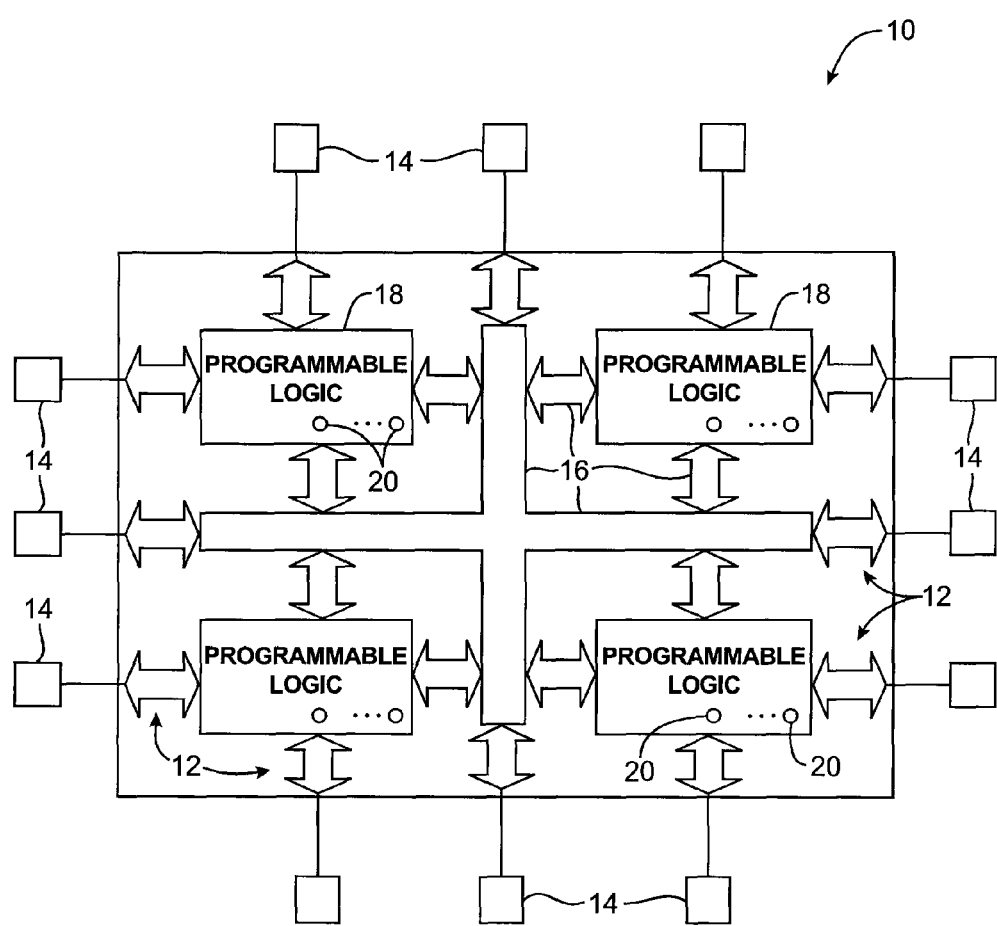
FIG. 1 is a diagram of an illustrative programmable logic device in accordance with the present invention.

An illustrative programmable logic device 10 in accordance with the present invention is shown in FIG. 1.

Programmable logic device 10 has input/output circuitry 12 for driving signals off of device 10 and for receiving signals from other devices via input/output pins 14. Pins 14 may be any suitable types of pins or solder bumps for making electrical connections between the internal circuitry of device 10 and external packaging. Some of the pins 14 may be used for high-speed communications signals, other pins may be used to provide power supply voltages to the device 10 or may be used for DC or low-frequency signals.

Interconnection resources 16 such as global and local vertical and horizontal conductive lines and busses may be used to route signals on device 10. Other circuitry 18 on device 10 includes blocks of programmable logic, memory blocks, regions of digital signal processing circuitry, processors, etc. The programmable logic in circuitry 18 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers.

Some of the logic of programmable logic device 10 is fixed (hardwired). The logic in device 10 also includes components that may be configured so that device 10 performs a desired custom logic function. Programmable logic in programmable logic device 10 may be based on any suitable programmable technology. With one suitable approach, configuration data may be loaded into programmable elements. The collection of programmable elements in a device is often referred to as configuration memory. The configuration data, which is sometimes referred to as programming data, is loaded into the configuration memory in the programmable logic device 10 using pins 14 and input/output circuitry 12. During normal operation of device 10 in a finished system, the programmable elements in the configuration memory each provide a static control output signal that controls the state of an associated logic component in the programmable logic of circuitry 18.

In a typical arrangement, the programmable elements may be random-access memory (RAM) cells that are loaded from an external chip via certain pins 14 and appropriate portions of input/output circuitry 12. With some architectures, device 10 contains both RAM cells and nonvolatile memory. The configuration data is loaded into the nonvolatile memory, which in turn transfers the configuration data to the RAM cells internally.

The loaded RAM cells on the programmable logic device provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 10. Circuit elements in input/output circuitry 12 and interconnection resources 16 are also generally configured by the RAM cell outputs as part of the programming process (e.g., to customize I/O and routing functions). The circuit elements that are configured in input/output circuitry 12, interconnection resources 16, and circuitry 18 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from fuses or antifuses, programmable logic devices in which elements 34 are formed from electrically-programmable read-only-memory (EPROM) or erasable-electrically-programmable read-only-memory (EEPROM) technology, or programmable logic devices with programmable elements made from magnetic storage elements, etc. Illustrative programmable logic elements are shown schematically as elements 20 in FIG. 1.

Regardless of the particular type of programmable element arrangement that is used for the configuration memory of device 10, the configuration memory is preferably provided with configuration data by a user (e.g., a logic designer). Once provided with configuration data, the programmable elements in the configuration memory selectively control (e.g., turn on and off) portions of the circuitry in the programmable logic device 10 and thereby customize its functions so that it will operate as desired.

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources 16 such as associated vertical and horizontal interconnection conductors. Interconnection conductors may include global conductive lines that span substantially all of device 10, fractional lines such as half-lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more hierarchical levels or layers in which multiple large areas are interconnected to form still larger portions of logic. Still other device arrangements may use logic that is not arranged in rows and columns. Portions of device 10 (e.g., in input/output circuitry 12 and elsewhere) may be hardwired for efficiency. As an example, hardwired transmitter and receiver circuitry may be used to assist with high-speed serial communications functions. Hardwired digital signal processing circuitry (e.g., multipliers, adders, etc.) may also be used.

Figure 2:
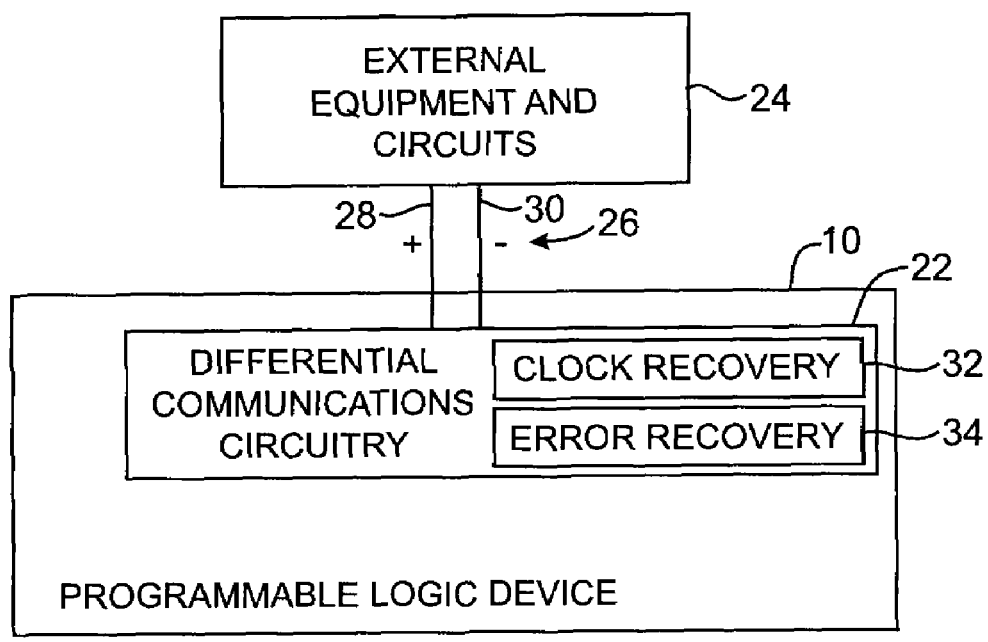
FIG. 2 is a diagram of an illustrative system environment in which a programmable logic device with differential communications circuitry such as universal serial bus communications circuitry is used in accordance with the present invention.

As shown in FIG. 2, a programmable logic device 10 in accordance with the present invention contains differential communications circuitry 22. Differential communications circuitry 22 may be universal serial bus communications circuitry or other suitable differential communications circuitry. Circuitry 22 may contain circuitry such as clock and data recovery circuitry 32 and error correction circuitry 34. Differential communications circuitry 22 supports communications over a differential communications path 26. Path 26 includes a pair of differential signal lines 28 and 30. Differential communications path 26 is used to connect programmable logic device 10 to external equipment and circuits 24.

In single-ended communications schemes, data is conveyed over single-line paths. Single-ended signals are referenced to ground.

With differential signaling schemes, a pair of signal conductors such as paths 28 and 30 carries the signals between external equipment and circuits 24 and device 10. Two I/O pads 14 (FIG. 1) on device 10 are used to route the differential signals to or from associated differential I/O buffers on the integrated circuit.

Differential signals are referenced to each other, rather than a source of ground potential. As shown in FIG. 2, one of the differential signals in each differential signal pair may be labeled "positive" and the other one of the differential signals in that pair may be labeled "negative."

Differential signaling schemes are generally more immune to noise than single-ended signaling schemes and can support higher data rates. A clock signal can be embedded into the differential data provided to device 10 over path 26. Clock and data recovery circuitry 32 in the differential communications circuitry 22 may be used to extract the embedded clock from the data. Data is conveyed serially over the differential signaling link 26 of FIG. 2, so differential communications circuitry 22 includes receiver circuitry with serial-to-parallel conversion circuitry and transmitter circuitry with parallel-to-serial conversion circuitry. Error correction circuitry 34 may be used to avoid problems with corrupted data transmissions.

At various stages during the life of a typical programmable logic device 10, different types of external equipment and circuits 24 are connected to the device 10 via paths such as path 26. In a preferred embodiment of the present invention, differential communications circuitry 22 supports a serial bus standard such as the universal serial bus (USB) standard, so that differential communications circuitry 22 can be used to form a useful communications port when programmable logic device 10 is installed in a system (i.e., during user mode operations). Advantageously, the same port can be used for programming and testing.

In a typical programming arrangement, external equipment called a device "programmer" or external circuitry may be connected to device 10. For example, an external integrated nonvolatile memory and loading circuit, sometimes referred to as a configuration device integrated circuit, may be connected to the device. If desired, separate nonvolatile memory and loading integrated circuits may be used. With another suitable configuration, device 10 includes loading circuitry that interfaces with an external nonvolatile memory device (e.g., a flash or EPROM device).

In a typical testing situation, the external equipment 24 that is connected to device 10 is a computer-based tester. The tester may have a probe head or a socket that is used to connect to device 10.

Figure 3:
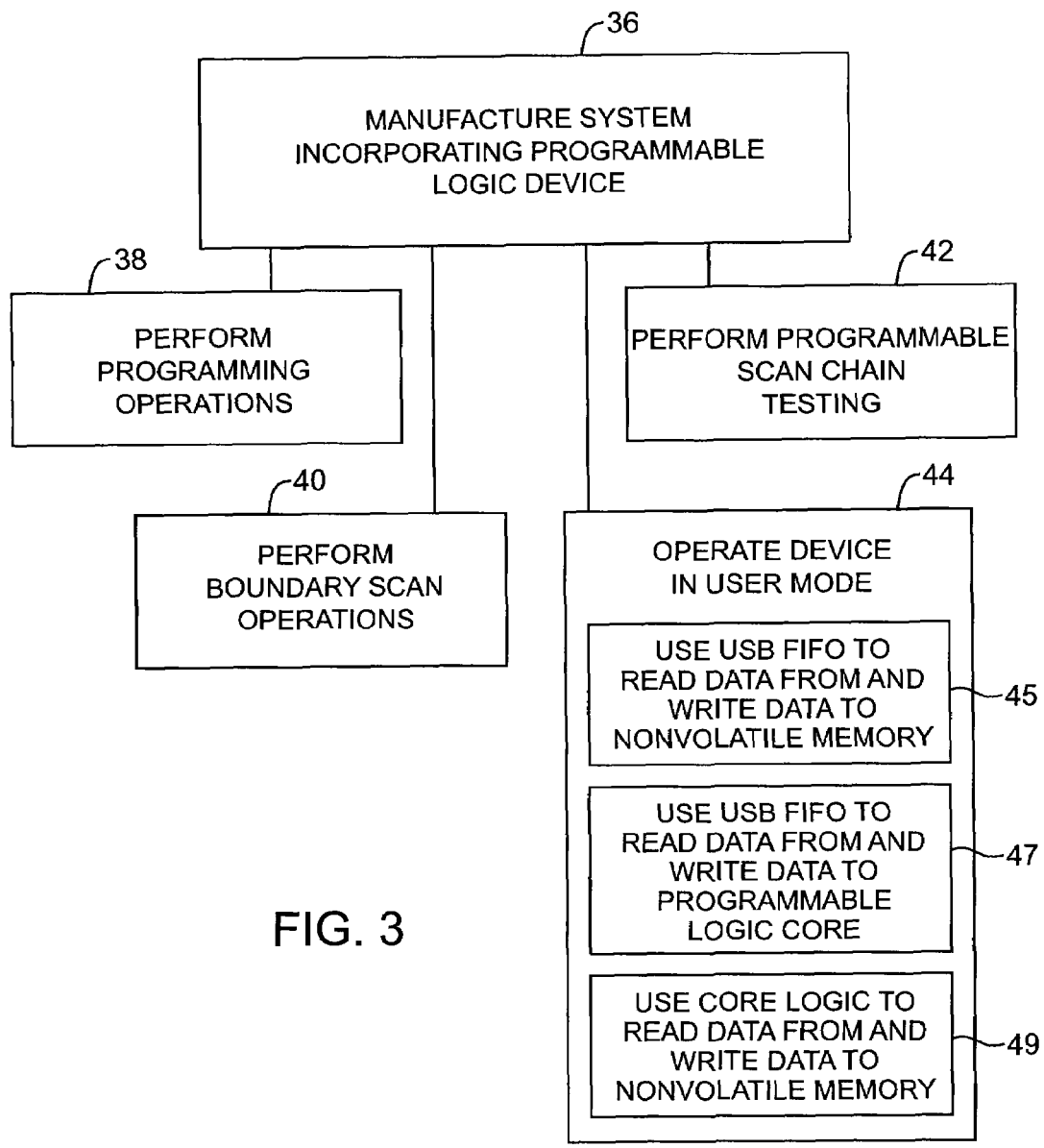
FIG. 3 is a flow chart of illustrative steps involved in using a programmable logic device with differential communication circuitry in accordance with the present invention.

A flow chart of illustrative steps involved in using a programmable logic device 10 in accordance with the present invention is shown in FIG. 3.

At step 36, a manufacturer produces a system incorporating a programmable logic device 10. The programmable logic device 10 may be the only integrated circuit in the system or there may be multiple integrated circuits in the system. Typical integrated circuits that may be incorporated into a system with a programmable logic device integrated circuit include memory devices, digital signal processors, application specific integrated circuits, microprocessors, digital-to-analog and analog-to-digital circuits, etc. The circuits may be mounted on a circuit board or other suitable mounting structure. A typical circuit board has conductive traces that are used form paths such as path 26 of FIG. 2 and paths between circuit pins and other conductive structures (e.g., board-level conductors such as power, ground, and data edge connectors, etc.)

Boundary scan operations may be performed at step 40. In a typical arrangement, programmable logic device 10 contains a chain of linked registers called a scan chain. Test data can be loaded into the device by serially loading the test data into the scan chain. The scan chain can also be used to capture test data samples. At least some of the scan chain is preferably located at the boundary of the device (i.e., adjacent to associated input-output pins). Accordingly, the scan chain is sometimes referred to as a boundary scan chain or boundary scan circuitry.

Programmable scan chain testing may be performed at step 42. Unlike the boundary scan testing of step 40, the programmable scan chain testing operations of step 42 involve configuring programmable pathways and programmable registers to form the desired scan chain prior to testing.

In one suitable testing scenario, both the boundary scan operations of step 40 and the programmable scan chain testing operations of step 42 are used. Test data is loaded and unloaded using the differential communications circuitry 22 (FIG. 2), so that test throughput is high and the probability of data corruption during testing is low. Moreover, when testing is complete, the differential communications circuitry 22 of FIG. 2 can be used for programming and user mode operations.

Programming operations are performed during step 38. In a typical scenario, the device 10 is installed on a circuit board containing a differential communications port connector. The connector may be connected to a cable during testing (steps 40 and 42). During programming, programming data is loaded into the device 10 over a differential communications path 26 between device 10 and a configuration device or other source of programming data. Programming can be performed at high speeds due to the use of the differential signal path.

After the programmable logic device 10 has been programmed, the device 10 can be used in a system (step 44). Preferably, the same differential communications circuitry 22 that was used during the operations of steps 38, 40, and 42 is used during user mode operations (step 44). With one suitable arrangement, the differential signaling path and differential communications circuitry 22 supports a popular differential signally standard such as the universal serial bus (USB) standard. The use of differential communications circuitry 22 that supports USB communications is, however, merely illustrative. Other differential signaling schemes may be used if desired. An advantage of the USB protocol is that is widely used in electronic devices. The use of a USB-based differential signaling scheme is used hereinafter as an example.

Figure 4:
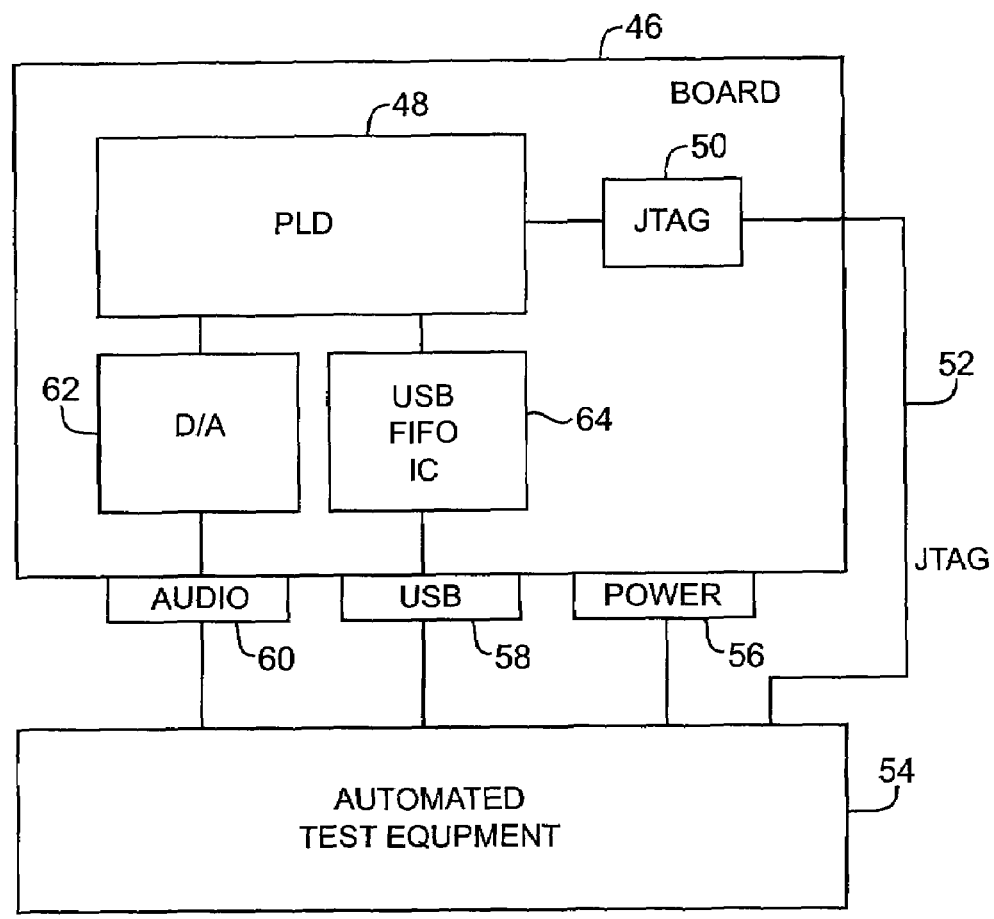
FIG. 4 is a diagram of a system containing a conventional programmable logic device with a JTAG port connected to automated test equipment.

A conventional arrangement that may be used to program and test a conventional programmable logic device is shown in FIG. 4. A shown in FIG. 4, a conventional system may have a programmable logic device 48 mounted on a circuit board 46. A JTAG connector plug 50 is mounted on board 46. The JTAG interface uses a ten-pin connector format. A ten-pin receptacle is mounted on board 46 and receives a ten-pin plug on the end of a cable. In this example, integrated circuits such as digital-to-analog converter integrated circuit 62 and universal serial bus first-in-first-out (FIFO) integrated circuit 64 are also mounted on board 46. USB FIFO 64 and USB connector 58 form a USB port.

Automated test equipment 54 is used to perform tests on board 46. Automated test equipment 54 generally has a computer to control testing operations and is connected to a test fixture. The test fixture contains connectors for connecting automated test equipment 54 to the connectors available on board 46. In the example of FIG. 4, board 46 has an audio jack 60, a USB connector 58, and a power receptacle 56. A JTAG cable 52 is used to connect automated test equipment 54 to the JTAG connector 50. Respective paths are also formed between connectors 60, 58, and 56 and the automated test equipment 54.

Using a configuration of the type shown in FIG. 4, configuration data (e.g., test configuration data) may be loaded into device 46 through JTAG port 50. Configuration data cannot be loaded through the USB port, because conventional programmable logic devices are incapable of receiving programming data in this way.

During testing, JTAG port 50 may be used to load and unload boundary scan data from device 48. Power may be applied through connector 56. Automated test equipment 54 may interact with board 46 through connectors 60 and 58 to help determine whether board 46 is working properly. When it is time to use board 46 in a system, the JTAG connector 50 will generally not be used. This is because the JTAG standard is only generally employed to support programming and boundary scan operations, not user mode communications. After programming operations are complete, the presence of the JTAG port does not add commercial value to the device.

Figure 5:
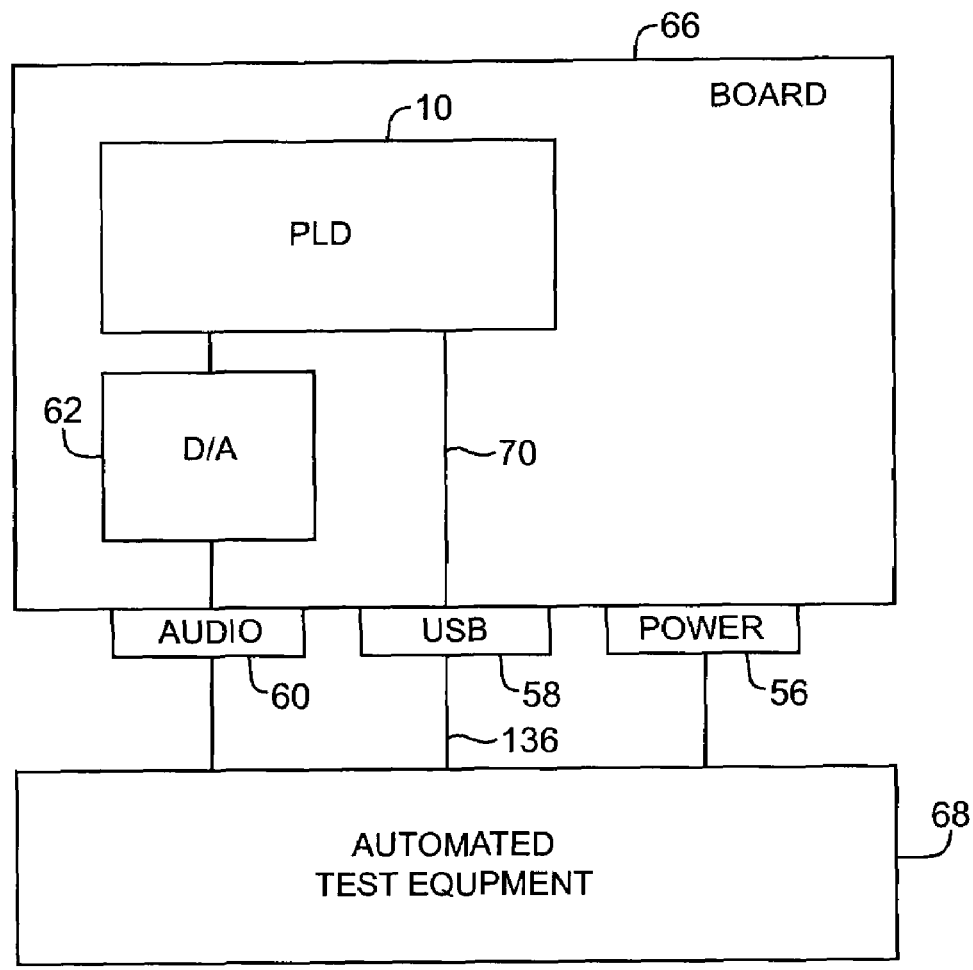
FIG. 5 is a diagram of a system containing a programmable logic device with universal serial bus programming and testing capabilities in accordance with the present invention.

An illustrative arrangement for programming and testing a system with a programmable logic device 10 in accordance with the present invention is shown in FIG. 5. As shown in FIG. 5, programmable logic device 10 may be mounted on a circuit board 66 or other suitable mounting structure for use in a system. During testing, board 66 may be inserted in a test fixture associated with automated test equipment 68. The test fixture may have connectors for mating with connectors on circuit board 66. Power connector 56, USB connector 58, and audio connector 60 (in this example) may be electrically connected to the test fixture. As with the conventional programmable logic device example of FIG. 4, a digital-to-analog converter integrated circuit 62 forms an interface between the programmable logic device and audio plug 60.

Unlike the conventional arrangement of FIG. 4, board 66 does not contain USB FIFO circuitry, because programmable logic device 10 supports USB operations internally. As a result, a USB communications path 70 on board 66 may be used to connect USB connector 58 to programmable logic device 10. USB communications path 70 includes a differential signaling path such as path 26 of FIG. 2 and may optionally include standard USB power connections (e.g., for positive and ground power supplies). Power connector 56 can also be used for power signals (e.g., to provide power to board 66 from automated test equipment 68). No JTAG circuitry is needed on board 66, because the USB connector 58 and the USB capabilities of programmable logic device 10 are used to support programming and testing communications between external equipment such as automated test equipment 68 and programmable logic device 10. When board 66 is used in a finished system, the same USB connector 58 and the same USB capabilities of programmable logic device 10 may be used to handle user data traffic support. Unlike a JTAG port, the USB port is used after programming is finished, so the USB port adds commercial value to the device.

The process of performing programming operations (step 38 of FIG. 3) in accordance with an embodiment of the present invention is described in connection with FIGS. 6-9.

Figure 6:
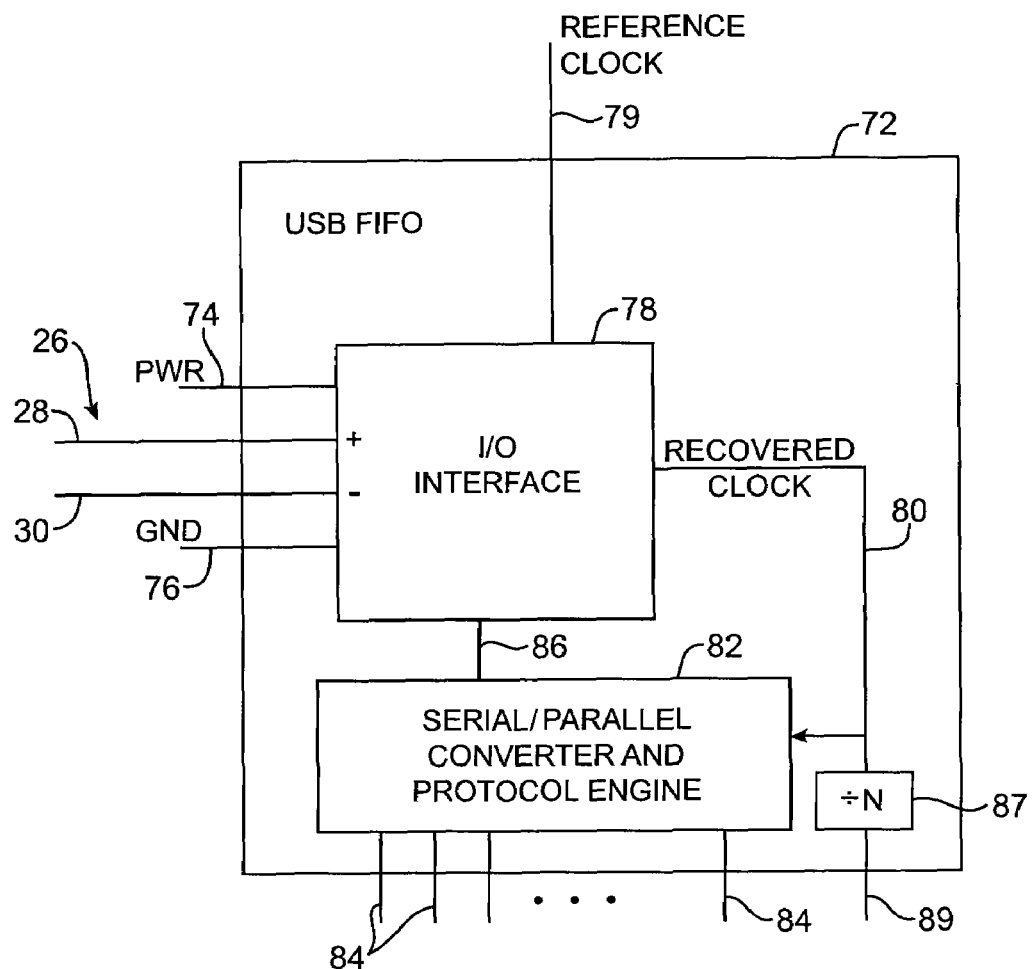
FIG. 6 is a diagram of illustrative universal serial bus first-in-first-out circuitry for a programmable logic device integrated circuit in accordance with the present invention.

Illustrative USB FIFO circuitry 72 that may be used on a programmable logic device 10 is shown in FIG. 6. Programmable logic devices 10 may have any suitable number of USB ports (e.g., one used for programming, testing, and user data and others used for user data). A programmable logic device 10 with a single USB port and a single corresponding USB FIFO 72 is described as an example.

USB FIFO 72 has an input-output (I/O) interface circuit 78. I/O interface 78 is connected to a differential signaling path 26 made up of conductors 28 and 30. A typical USB port has associated conductors for power 74, ground 76, and differential signals 26.

When receiving differential data signals with an embedded clock, clock and data recovery circuitry in I/O interface 78 extracts the embedded clock. The recovered clock signal is provided to serial/parallel converter and protocol engine 82 via path 80. The clock is also provided alone with the parallel data interface 84. The recovered clock may be divided by N using divider 87. This division will match the parallel bus width 84.

I/O interface 78 contains a differential input buffer and other receiver circuitry to receive incoming serial data. The differential input buffer converts incoming differential signals into single-ended serial data signals for processing by the core logic of device 10. The received serial data is provided to serial/parallel converter and protocol engine 82 over path 86. Converter 82 converts the received serial data into parallel data and outputs the parallel data on lines 84 for use by core logic on the programmable logic device 10.

Parallel data from the core logic may be provided to serial/parallel converter and protocol engine circuitry 82 via lines 84. Converter 82 converts the parallel data into serial data, which is provided to a differential output buffer in I/O interface 78 over path 86. The differential output driver in I/O interface 78 drives the outgoing data off of device 10 over differential signal path 26.

When transmitting data out of the I/O interface 78 over lines 28 and 30, the I/O interface circuitry and the serial/parallel converter and protocol engine will use reference clock 79 to set the data rate and will embed the clock in the transmitted data.

The protocol engine portion of circuitry 82 is used to handle USB protocol support operations such as handshaking, optional error correction (e.g., cyclic redundancy checks), link formation, error handling, etc.

Figure 7:
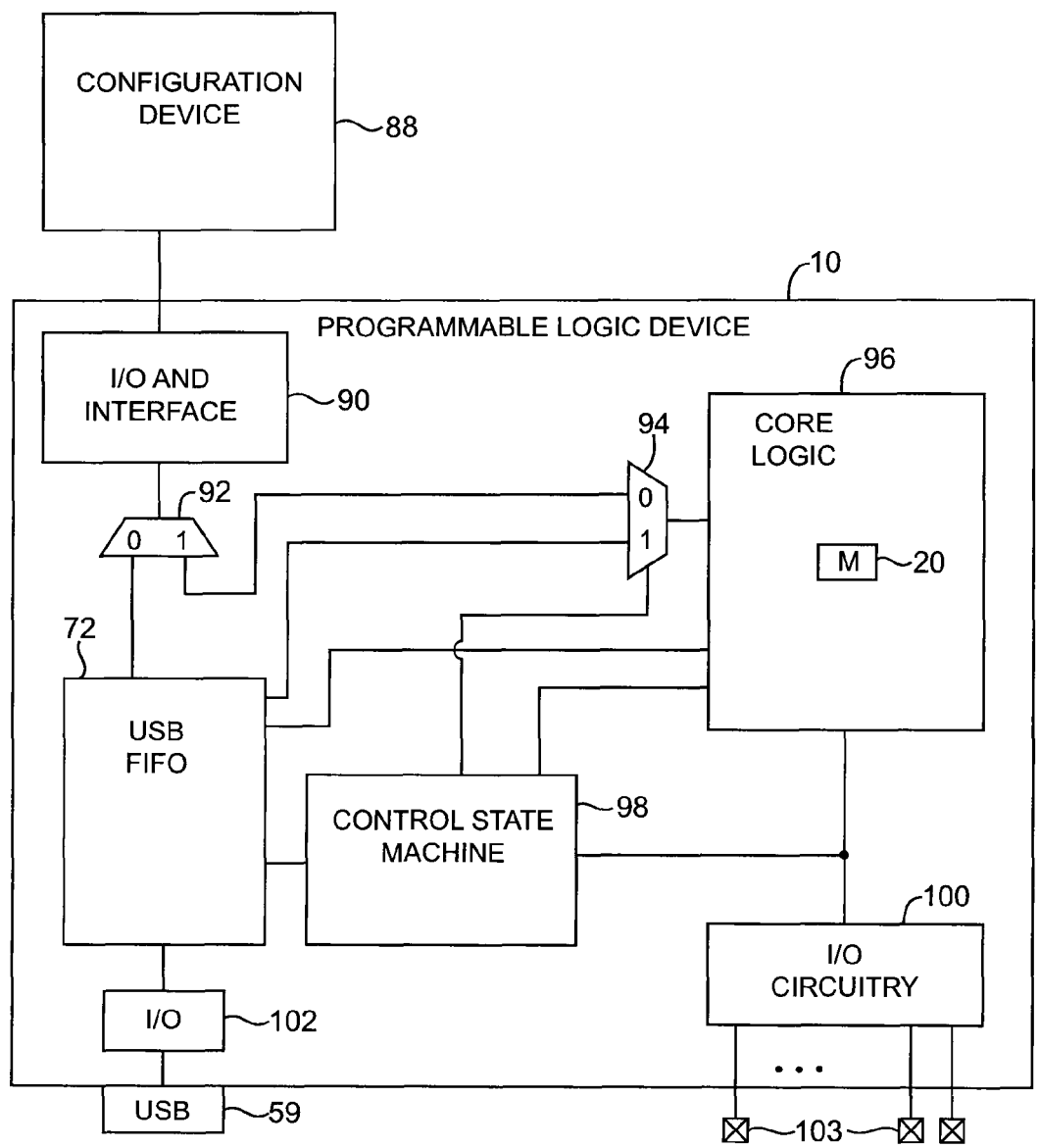
FIG. 7 is a diagram of an illustrative programmable logic device with universal serial bus capabilities that is loaded with configuration data using an external configuration device in accordance with the present invention.

Programmable logic devices 10 may be programmed using internal nonvolatile memory arrangements or using external nonvolatile memory arrangements. An illustrative programmable logic device 10 that may be programmed using an external nonvolatile memory arrangement is shown in FIG. 7. As shown in FIG. 7, programmable logic device 10 is connected to an external configuration device 88. Device 88 contains nonvolatile memory (e.g., flash memory) and can be programmed directly using a programmer or by providing configuration data to device 88 through device 10 using USB pins 59, I/O circuitry 102, USB FIFO 72, multiplexer 92, and I/O and interface circuitry 90. Stored configuration data in the nonvolatile memory can then be transferred from configuration device 88 to configuration memory 20 in core logic 96 using I/O and interface circuitry 90, multiplexer 92, and multiplexer 94. Core logic 96 contains configuration memory 20, programmable interconnects, and programmable logic circuitry.

Control state machine 98 receives instructions from external devices via the USB FIFO 72 and controls circuitry on device 10 such as multiplexers 92 and 94, I/O circuitry 100, etc. Control state machine 98 works with USB FIFO 72 in implementing functions such as device programming, testing, and user-mode operations. The I/O resources of I/O and interface circuitry 90, I/O circuitry 102, and I/O circuitry 100 are depicted as I/O circuitry 12 in FIG. 1. During user mode operations, core logic circuitry 96 interfaces with external circuits through general purpose I/Os 100 and pins 103 and through the USB port formed using USB pins 59 and I/O circuitry 102.

Figure 8:
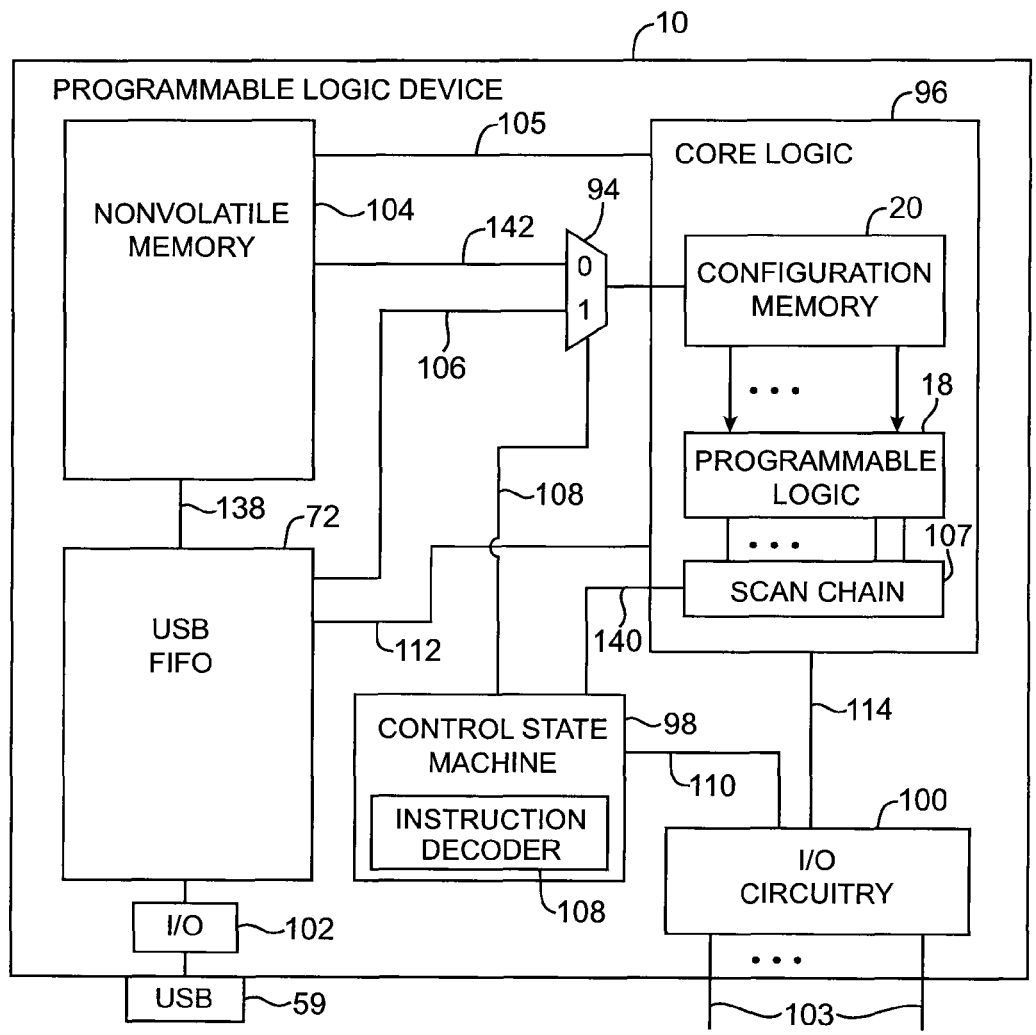
FIG. 8 is a diagram of an illustrative programmable logic device with universal serial bus capabilities that is loaded with configuration data using internal nonvolatile memory in accordance with the present invention.

Another illustrative architecture that may be used for programmable logic device 10 is shown in FIG. 8. The illustrative programmable logic device 10 of FIG. 8 contains nonvolatile memory 104, which is provided with configuration data from an external source using USB pins 59, I/O circuitry 102, and USB FIFO 72.

Core logic 96 contains configuration memory 20 that produces static control signals for configuring programmable logic 18. If desired, some of the resources of core logic 96 may be programmed to form a scan chain 107. Internal scan chains such as these that are configured to perform customized testing operations are sometimes referred to as programmable scan chains. Boundary scan operations may be performed using boundary scan registers in input-output circuitry 100.

During system power-up operations, the configuration data stored in nonvolatile memory 104 is loaded into configuration memory 20 of core logic 96 via multiplexer 94. Configuration memory 20 may be loaded with configuration data in real time during diagnostic operations using USB FIFO 72, path 106, and multiplexer 94. The control state machine 98 controls multiplexer 94 and other circuitry on device 10 in accordance with instructions that are received from external devices via USB FIFO 72. For example, control path 108 may be used to control multiplexer 94 and path 110 may be used to control I/O circuitry 100. The instructions for control state machine 98 can be decoded using instruction decoder 108.

During user mode operations, signals may be conveyed to and from programmable logic 18 in core logic 96 using path 112, USB FIFO 72, I/O circuitry 102 and USB pins 59 and using path 114, I/O circuitry 100, and pins 103. In this way, the USB port created using USB FIFO 72 can be used during user mode operations to read data from and write data to the core logic of the device (step 47 of FIG. 3). In addition, the USB port can be used to write to and read from the nonvolatile memory 104 using path 138. Path 138 can be used during these read and write operations using FIFO 72 without using core logic 96 (step 45 of FIG. 3). If desired, core logic 96 may store data in nonvolatile memory 104 using path 105 without using USB FIFO 72 and core logic 96 may read data from nonvolatile memory 104 over path 105 without using USB FIFO 72 (step 49 of FIG. 3).

In general, any suitable architecture may be used for a programmable logic device integrated circuit with differential communications support in accordance with the present invention. Use of an architecture of the type shown in FIG. 8 is described herein as an example.

Figure 9:
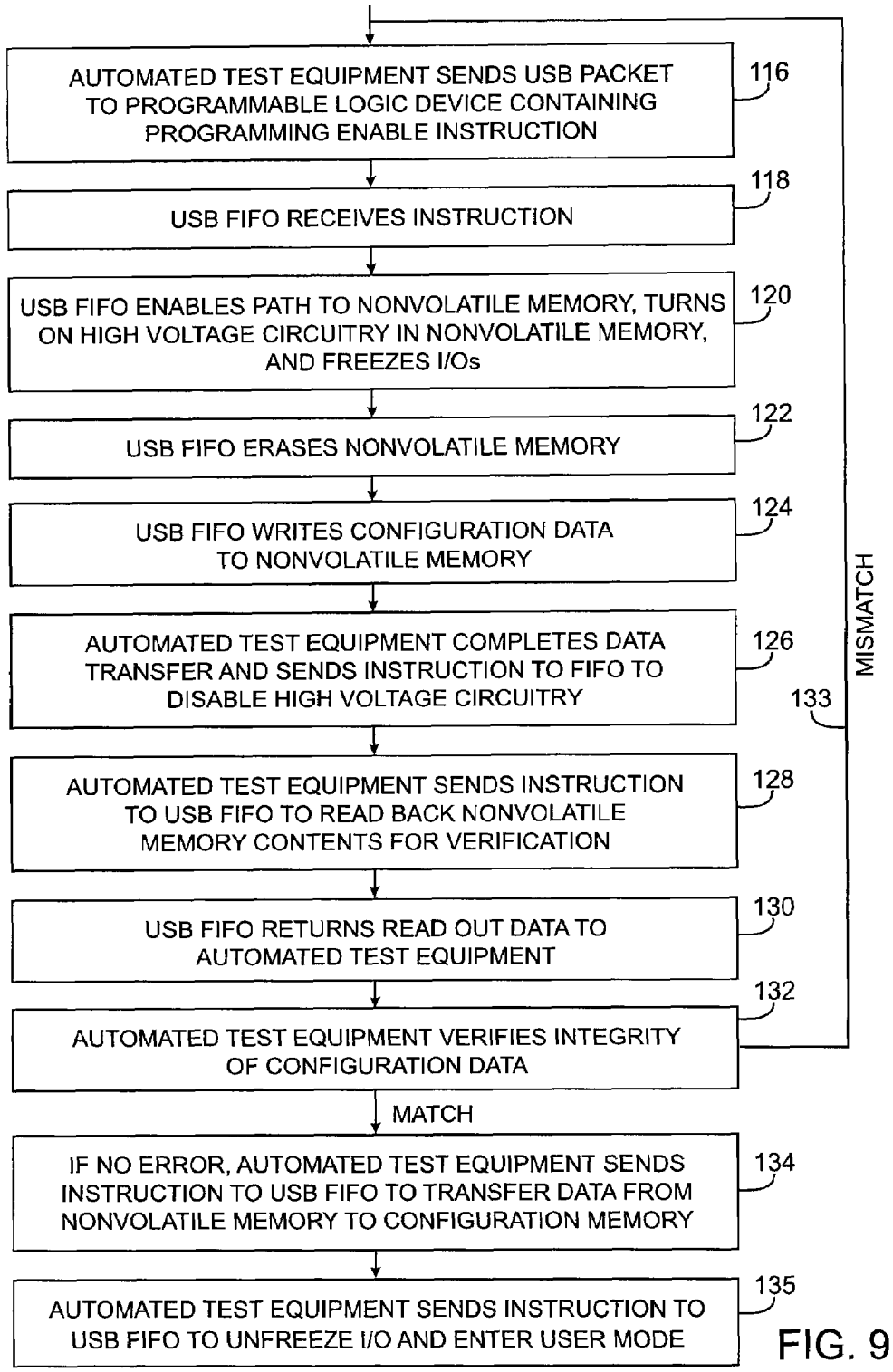
FIG. 9 is a flow chart of illustrative steps involved in programming a programmable logic device with universal serial bus capabilities in accordance with the present invention.

Illustrative steps involved in programming a programmable logic device of the type shown in FIG. 8 are shown in FIG. 9.

At step 116, automated test equipment such as automated test equipment 68 of FIG. 5 or any other suitable equipment (e.g., a programmer or other computing equipment) may send a USB packet to the programmable logic device 10 over a USB path. With a typical scenario, the programmable logic device 10 is connected to a USB connector (e.g., by virtue of being installed on a system board 66 of the type shown in FIG. 5). The automated test equipment 68 and programmable logic device 10 are connected by a USB cable 136 (FIG. 5) that is plugged into the USB connector. During step 116, the automated test equipment transmits the USB packet to the programmable logic device over the USB cable. The USB packet contains a programming enable instruction that directs the programmable logic device integrated circuit 10 to prepare for programming operations.

At step 118, USB FIFO 72 receives the instruction and control state machine 98 uses instruction decoder 108 to decode the instruction.

At step 120, in response to the instruction, the USB FIFO 72 and control state machine 98 enable path 138 (FIG. 8), turn on high voltage programming circuitry in nonvolatile memory 104, and freeze I/O circuitry 103 to prevent circuit damage. Paths 112 and 140 (FIG. 8) are disabled to isolate core logic 96.

At step 122, in response to a command received from the automated test equipment, the USB FIFO 72 erases nonvolatile memory 104 (FIG. 8) in preparation for configuration data storage.

At step 124, in response to a command received from the automated test equipment, the USB FIFO 72 obtains configuration data from the automated test equipment over the USB cable and stores the received configuration data in nonvolatile memory 104.

At step 126, the automated test equipment completes the data transfer process and sends an instruction to the USB FIFO to disable the high voltage circuitry. (If a nonvolatile memory technology with low-voltage capabilities is used, the high voltage circuit functions can be performed using low voltage storage circuitry.)

At step 128, the automated test equipment sends an instruction over the USB cable or other USB path to the USB FIFO 72 to read back the nonvolatile memory contents for verification.

The USB FIFO supplies the requested data from the nonvolatile memory to the automated test equipment over the USB path at step 130.

At step 132, the automated test equipment compares the requested data to the data originally transmitted to the device 10. If there is a data mismatch, then the data storage process can be repeated as indicated by line 133. If the verification operation is satisfactory, the automated test equipment sends a programming instruction to the USB FIFO 72 at step 134. The instruction of step 134 directs the USB FIFO to transfer the configuration data that was stored in the nonvolatile memory 104 to the configuration memory 20 in core logic 96 (FIG. 8). During the transfer, the control state machine 98 directs multiplexer 94 to connect path 142 to configuration memory 20 (FIG. 8). Once the configuration memory 20 has been loaded with configuration data, the device 10 is programmed. If the data is a match, the device moves to step 135. The automated test equipment sends a command to release internal resets and to unfreeze I/Os so device I/Os can begin to operate based on an application programmed into configuration memory 20.

The operations of FIG. 9 use the USB protocol, so data rates are high (e.g., 480 Mbps). This level of performance cannot be achieved using the low-voltage transistor-transistor logic (LVTTL) and low-voltage complementary metal-oxide-semiconductor (LVCMOS) technology of a conventional JTAG port. Conventional JTAG ports are limited to data rates of 25-40 MHz. Moreover, the error correction available with USB communications reduces the likelihood of data corruption during configuration data transmissions, which is particularly critical for large configuration data files. Configuration data files approaching 100 Mbit sizes are not uncommon, but conventional JTAG communications do not support error correction. Sum parity approaches are available conventionally and have been used to provide JTAG communications with a form of error detection, but this type of error detection arrangement is programmable-logic-device-vendor dependent and is not supported by the JTAG protocol.

The relatively high throughput and noise immunity of the USB protocol are also advantageous during programmable logic device testing. In general, a programmable logic device 10 in accordance with the present invention can contain any suitable testing support circuitry. For example, the programmable logic device 10 can contain boundary scan circuitry for supporting boundary scan testing as described in connection with step 40 of FIG. 3. If desired, the programmable logic device 10 can also contain circuitry for performing scan chain testing using programmable scan chains as described in connection with step 42 of FIG. 3.

Figure 10:
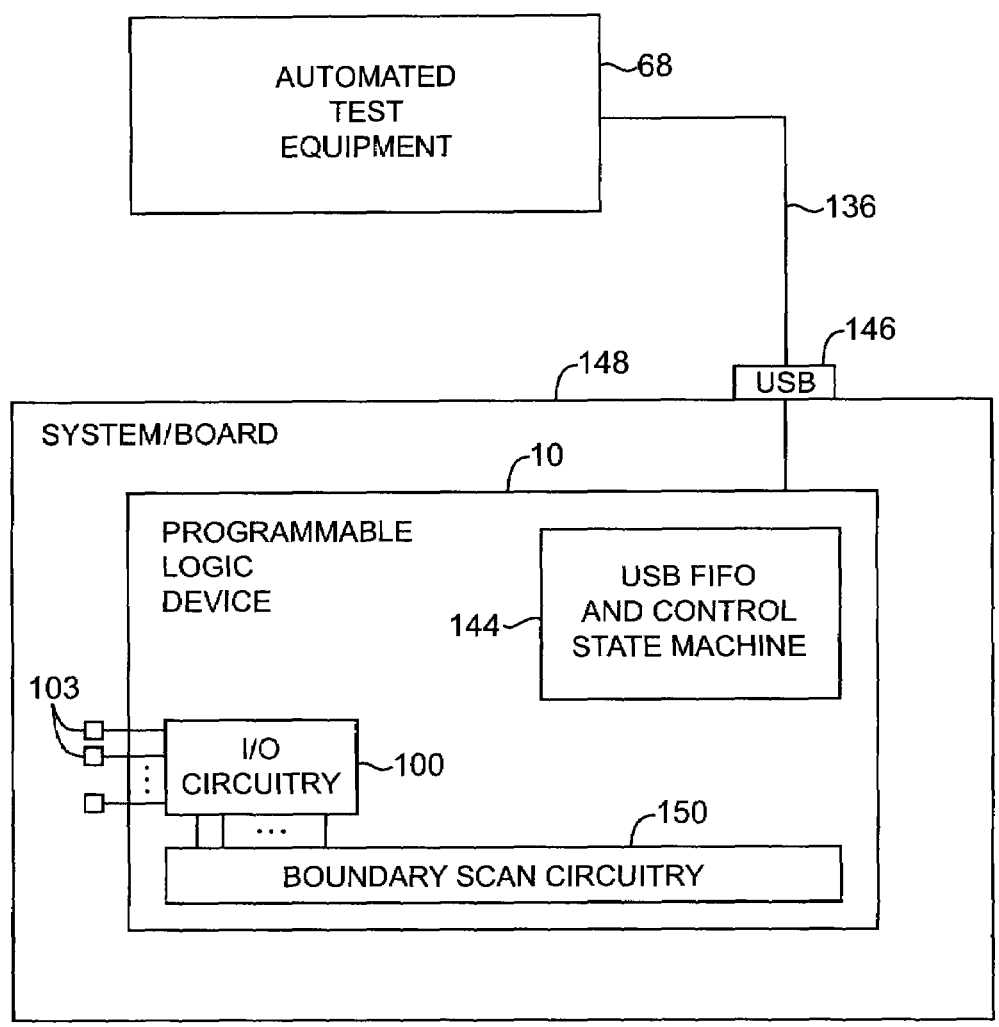
FIG. 10 is a diagram of an illustrative system in which a programmable logic device with universal serial bus capabilities can be used to support boundary scan operations in accordance with the present invention.

FIG. 10 shows an illustrative system environment of the type that may be used when performing boundary scan testing on a programmable logic device 10 in accordance with the present invention (step 40 of FIG. 3). As shown in FIG. 10, programmable logic device 10 is typically mounted on a circuit board 148 or other suitable system mounting structure. The board 148 may have a universal serial bus connector 146 that receives a mating plug at one end of universal serial bus cable 136. Cable 136 connects automated test equipment 68 directly to the circuit board 148. USB FIFO and control state machine circuitry 144 handles device control operations and provides USB communications support. Boundary scan circuitry 150 contains a scan chain made up of linked registers. The scan chain of circuitry 150 may, for example, include registers associated with the input-output pins of programmable logic device 10, so that these pins may be loaded with test data and so that data signals appearing on these pins can be sampled during a boundary scan test. In a typical test data capture scenario, test data is captured in parallel using the scan chain registers and is then serially unloaded though the scan chain and circuitry 144 for analysis by automated test equipment 68. The boundary scan circuits 150 can drive the I/O circuitry 100 during test mode.

Figure 11:
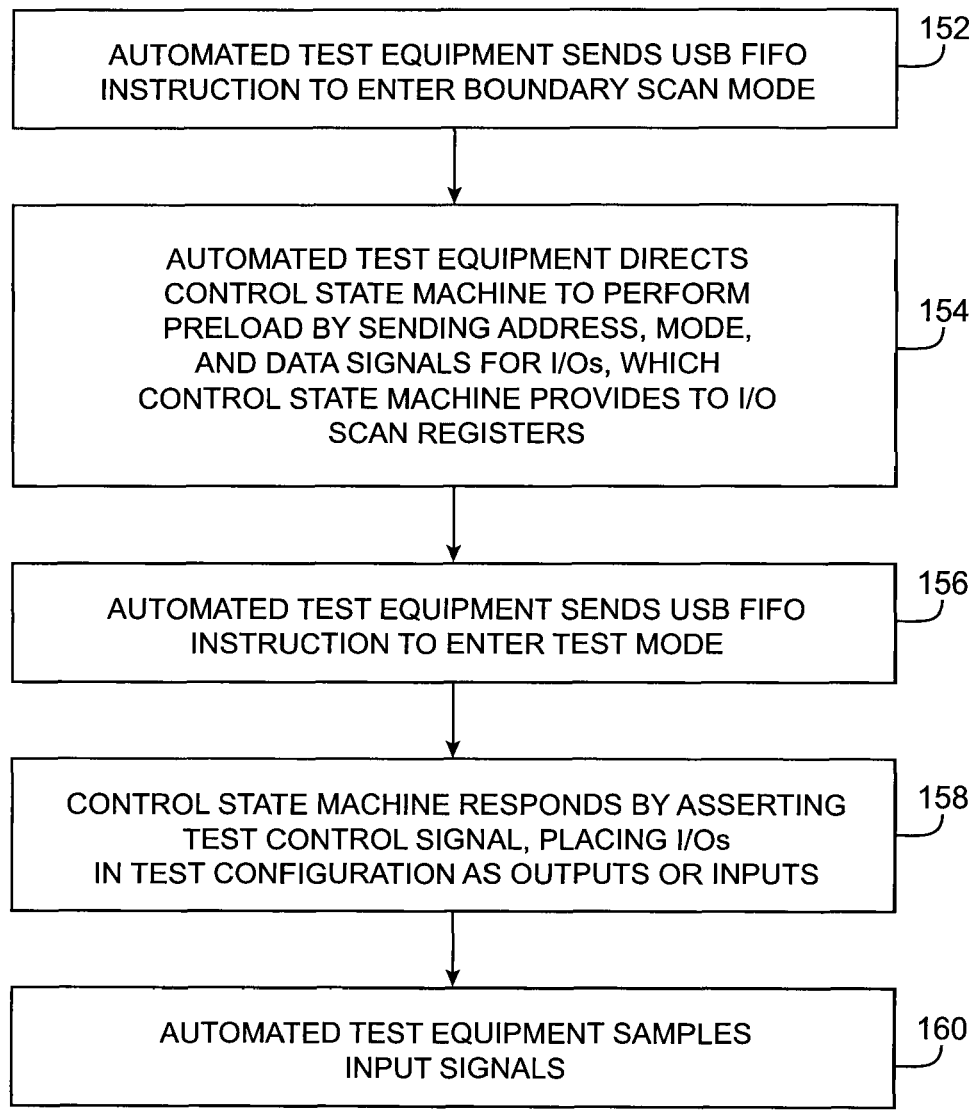
FIG. 11 is a flow chart of illustrative steps involved in using a programmable logic device with universal serial bus capabilities to perform boundary scan testing in accordance with the present invention.

Illustrative steps involved in performing boundary scan testing using a programmable logic device 10 of the type shown in FIG. 10 are shown in FIG. 11.

At step 152, the automated test equipment 68 sends the USB FIFO 144 an instruction to place programmable logic device 10 in boundary scan mode.

In response, at step 154, the automated test equipment directs the control state machine to perform preload operations and sends circuitry 144 address, mode, and data signals through the USB FIFO. The control state machine preloads the boundary scan chain by providing the address, mode, and data signals to the scan chain registers associated with the input-output circuitry of device 10.

Figure 12:
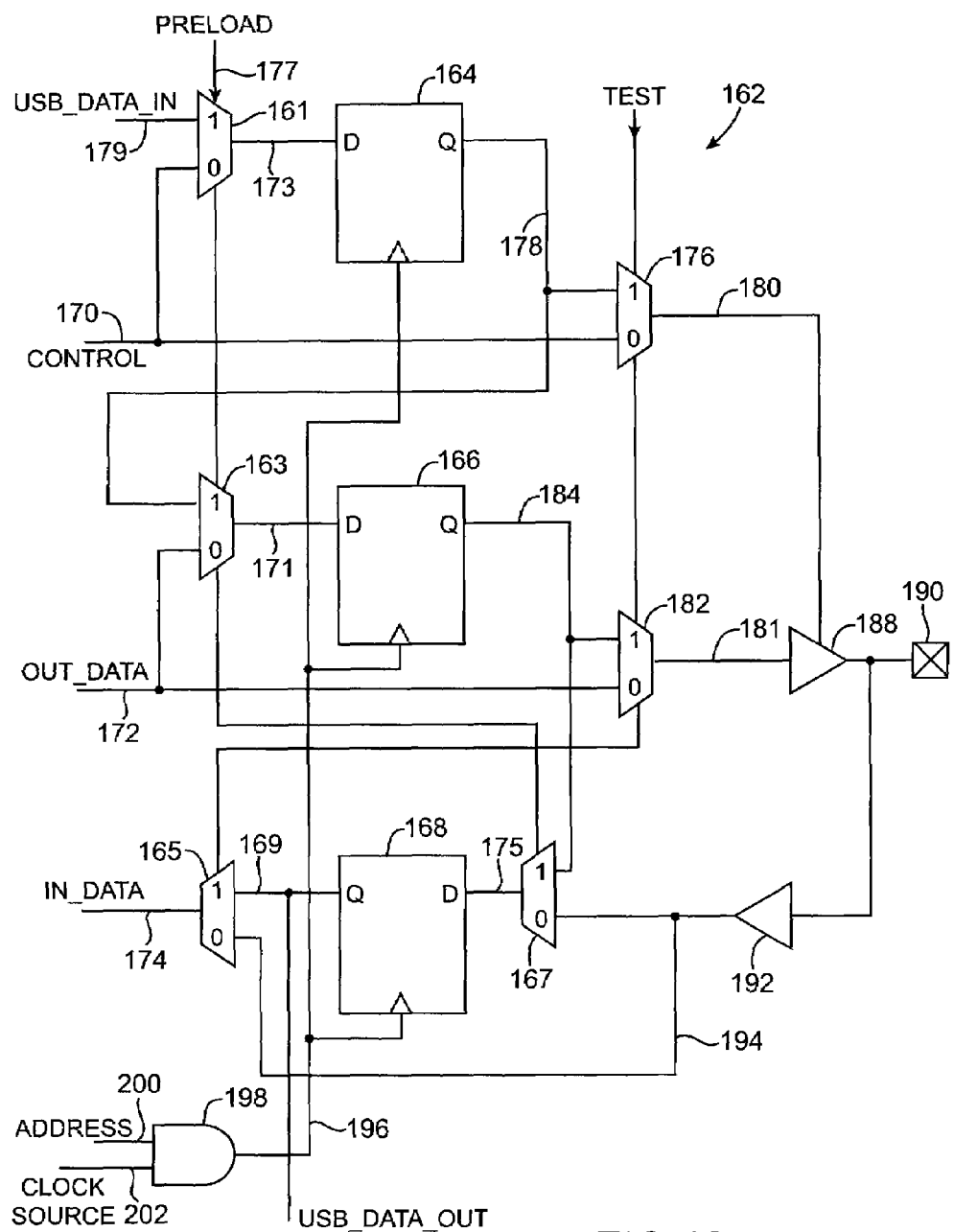
FIG. 12 is a diagram of an illustrative input-output circuit block that may be used as part of a boundary scan circuit on a programmable logic device in accordance with the present invention.

Any suitable technique may be used during the preload operations of step 154. One suitable approach is illustrated in connection with FIG. 12. The diagram of FIG. 12 shows an illustrative block 162 of input-output circuitry. In a typical programmable logic device 10, there are numerous input-output circuit blocks of the type shown in FIG. 12, which are connected to form a scan chain. During operation, the control state machine takes address line 200 high. Address gate 198 produces a high signal on its output 196 during the next clock pulse produced by clock source 202. This clock signal is distributed to the clock inputs of registers 164, 166, and 168. After block 162 has been addressed in this way, the control state machine transfers three bits of data from the USB FIFO to the I/O block 162 (CONTROL, OUT_DATA or IN_DATA as appropriate). This process is then repeated for all of the input-output circuit blocks on the device 10. During the preload operation of step 154, the USB FIFO and control state machine 144 (FIG. 10) takes the signal PRELOAD on line 177 high, so that the inputs of the registers 164, 166, and 168 of the input-output block 162 are connected as a scan chain connected to the USB port (USB_PORT) made up of lines 179 and 169 via multiplexers 161, 163, and 167 and registers 164, 166, and 168. When the signal PRELOAD is taken high, multiplexer 161 connects its "1" input to its output 173, multiplexer 163 connects its "1" input to its output 171, and multiplexer 167 connects its "1" input 183 to its output 175. The data on the multiplexer outputs 173, 171, and 175 determines the state to be loaded into the registers 164, 166, and 168 on the next clock pulse on line 196.

As shown in FIG. 11, after preloading operations are complete at step 154, automated test equipment 68 sends USB FIFO and control state machine 144 an instruction to place programmable logic device 10 in test mode (step 156).

At step 158, the USB FIFO and control state machine 144 takes the TEST signal high, so that the input-output circuit blocks of boundary scan circuitry 150 such as input-output circuit block 162 of FIG. 12 are configured as inputs or outputs. When the signal TEST is taken high, multiplexer 176 connects its "1" input to its output 180, multiplexer 182 connects its "1" input to its output 181, and multiplexer 165 connects its "1" input (line 169) to its output 174. The state of the CONTROL signal on line 180 controls whether the block is configured as an input or an output.

If CONTROL is 1, the output 178 of register 164 will go high after the clock pulse on line 196. The high signal on line 178 serves as an enable signal for output buffer 188 when TEST is high. In this configuration, the output buffer drives the output signal 181 that was provided to multiplexer 182 by lie 184 to pin 190 via buffer 188.

If CONTROL is 0, the output 178 of register 164 is low, so output buffer 188 is disabled. Pin 190 serves as an input pin in this configuration and signals from pin 190 are provided to the input multiplexer 165 of register 168 by input buffer 192. Input data that is gathered by register 168 is provided as the IN_DATA signal on line 174 through multiplexer 165 when the signal TEST is high.

To capture test data (i.e., boundary pin data on pins 103 of FIG. 10 and internal signals) during step 160, the automated test equipment sends a sample command to the USB FIFO and control state machine 144. The sample command directs the USB FIFO and control state machine to capture the test data with the scan chain. Each input-output block is addressed using an appropriate address line by taking the signal PRELOAD low. (PRELOAD is held high for preload operations and low for capturing test data.) The results of these test data capturing operations are passed to the automated test equipment by USB FIFO 144. Boundary scan tests of this type can be repeated until sufficient test coverage has been obtained.

Figure 13:
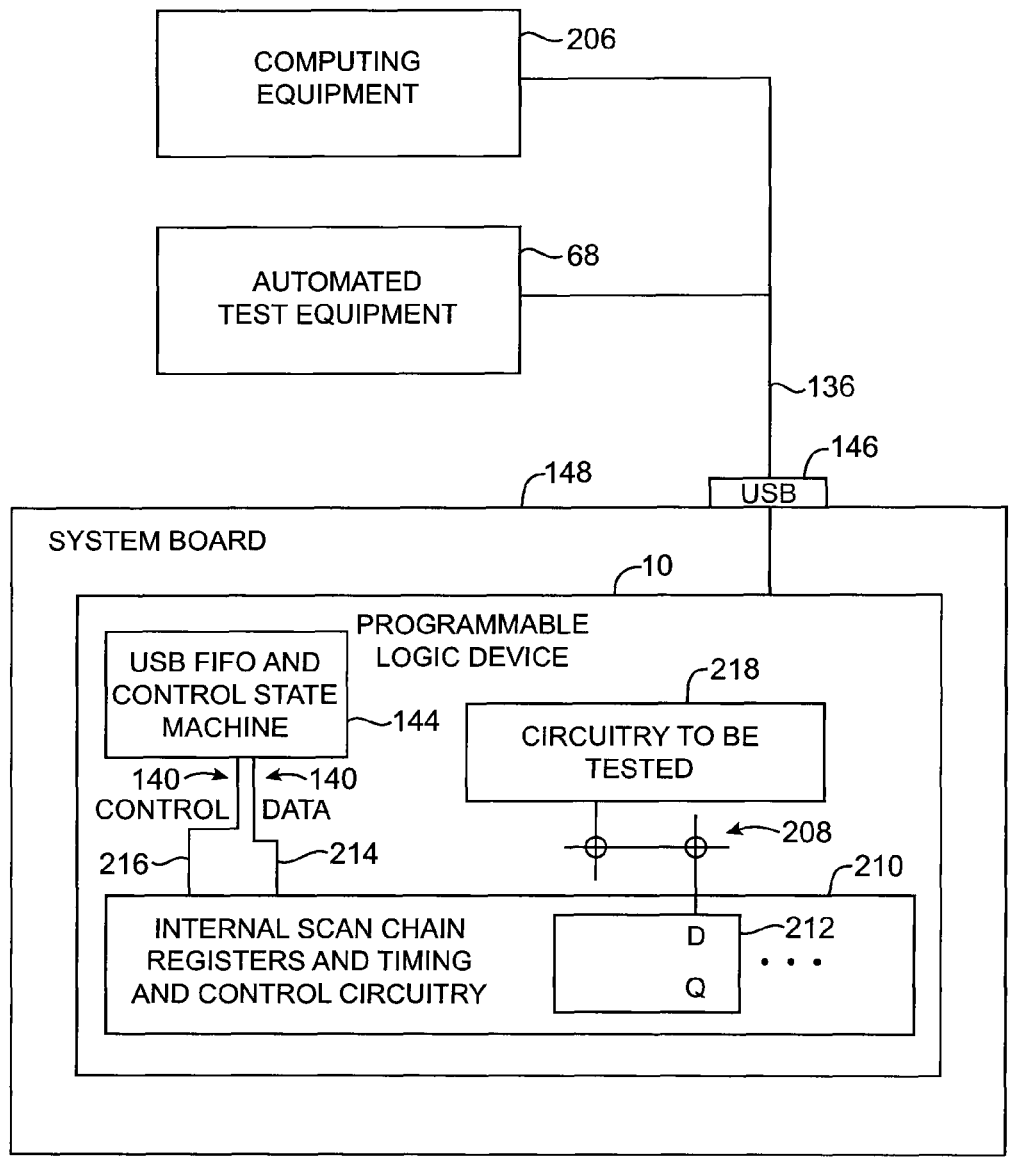
FIG. 13 is a diagram of an illustrative system environment in which a programmable logic device with universal serial bus capabilities is tested using a programmable scan chain in accordance with the present invention.

Programmable logic device integrated circuit 10 can also be used to perform programmable scan chain testing of the type described in connection with step 42 of FIG. 3. With this type of arrangement, the scan chain that is formed in the device 10 is based on programmable logic, so the location and size of the scan chain can be customized as needed for a particular test. An illustrative system environment in which a programmable logic device may be tested using a programmable scan chain is shown in FIG. 13. In the arrangement of FIG. 13, programmable logic device 10 is mounted on a system circuit board 148 or other suitable system mounting structure. The circuit board 148 has a universal serial bus connector 146 into which universal serial bus cable 136 is plugged. Computing equipment 206 and automated test equipment 68 may be connected to the system board 148 via cable 136. Computing equipment 206 may be a personal computer or other suitable computing equipment that is loaded with testing software so that computing equipment 206 can be used for USB-based programmable scan chain testing. With one suitable arrangement, automated test equipment 68 is used for programming device 10 and for performing boundary scan tests, whereas computing equipment 206 is used to perform programmable scan chain tests. This is, however, merely illustrative. Any suitable computer-based equipment may be used to apply programming and test signals to device 10 and to gather test data.

Programmable logic device 10 contains hardwired and programmable logic that has been programmed to form circuitry to be tested 218. Programmable interconnects 208 are programmed to form desired interconnection pathways between circuitry 218 and the registers 212 in internal scan chain registers and timing and control circuitry 210. The configuration of the scan chain registers 212 in circuitry 210 is programmed by the user as needed to perform a test. Control signals for programmable scan chain registers and timing and control circuitry 210 are provided via path 216. Path 214 is used to supply data to circuitry 210 (e.g., for preloading). Device 10 of FIG. 13 has USB FIFO and control state machine circuitry 144 for controlling the operation of device 10 during testing and for interfacing with equipment such as equipment 68 and computing equipment 206 over USB cable 136.

Figure 14:
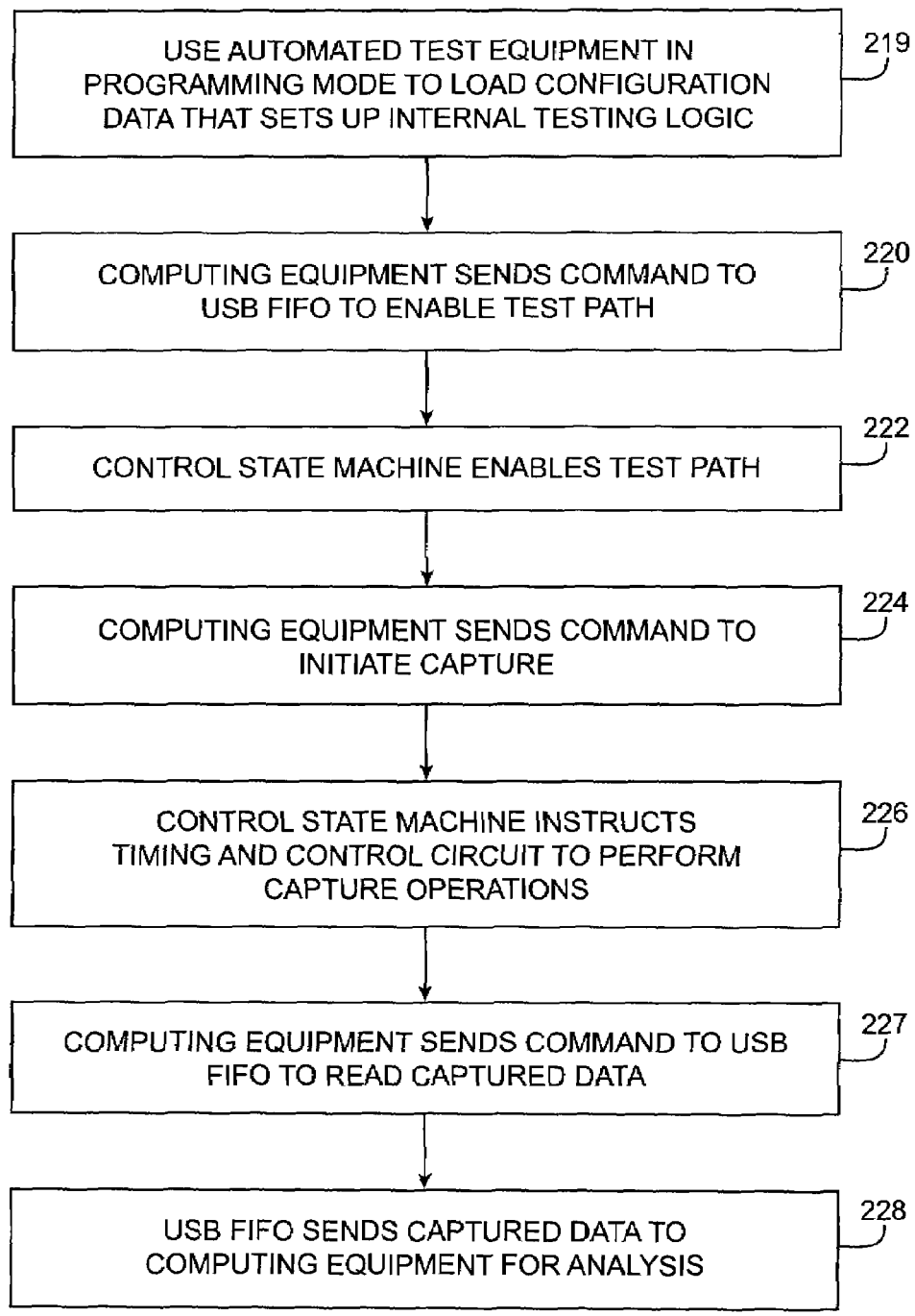
FIG. 14 is a flow chart of illustrative steps involved in performing programmable scan chain testing on a circuit such as the illustrative programmable logic device integrated circuit of FIG. 13 in accordance with the present invention.

Illustrative steps involved in performing programmable scan chain testing using the system arrangement and programmable logic device integrated circuit 10 of FIG. 13 are shown in FIG. 14.

At step 219, automated test equipment 68 (FIG. 13) is used to load configuration data into configuration memory in device 10. For example, automated test equipment 68 can use USB-based programming procedures of the type described in connection with FIG. 9. The programming operations of step 219 load configuration data that sets up the circuitry to be tested 218 and its associated programmable interconnect pattern 208 and sets up the internal testing capabilities of internal scan chain registers and timing and control circuitry 210 (e.g., by forming a desired scan chain from registers 212).

At step 220, the computing equipment 206 sends a command to the USB FIFO 144 to enable a test path 140 between the programmed scan chain in circuitry 210 and USB FIFO and control state machine circuitry 144 (FIGS. 8 and 13). The control state machine enables the test path 140 in response at step 222.

During step 224, the computing equipment 206 sends a command to the programmable logic device 10 to initiate the test data capture process.

At step 226, the programmable logic device 10 receives the command and initiates test data capturing operations. In particular, after decoding the command using the instruction decoder 108 (FIG. 8), the control state machine instructs the timing and control circuitry in circuitry 144 to perform a series of strobe-like capture operations, which allow high-speed core signals to be tapped using relatively slower-speed registers and test circuitry. The timing and control circuitry controls the programmed scan chain formed from registers 212 accordingly.

At step 227, computing equipment 206 sends a command to the USB FIFO directing the USB FIFO to read captured data.

At step 228, the USB FIFO sends the captured data to the computing equipment 206 over USB cable 136 for analysis. The computing equipment 206 analyzes the captured data. Tests may be repeated until sufficient test coverage has been obtained.

As described in connection with step 44 of FIG. 3, a programmable logic device that has been programmed and tested can be used to perform its intended custom logic function in a system. A programmable logic device that is operating normally in a finished system is sometimes referred to as operating in user mode.

Figure 15:
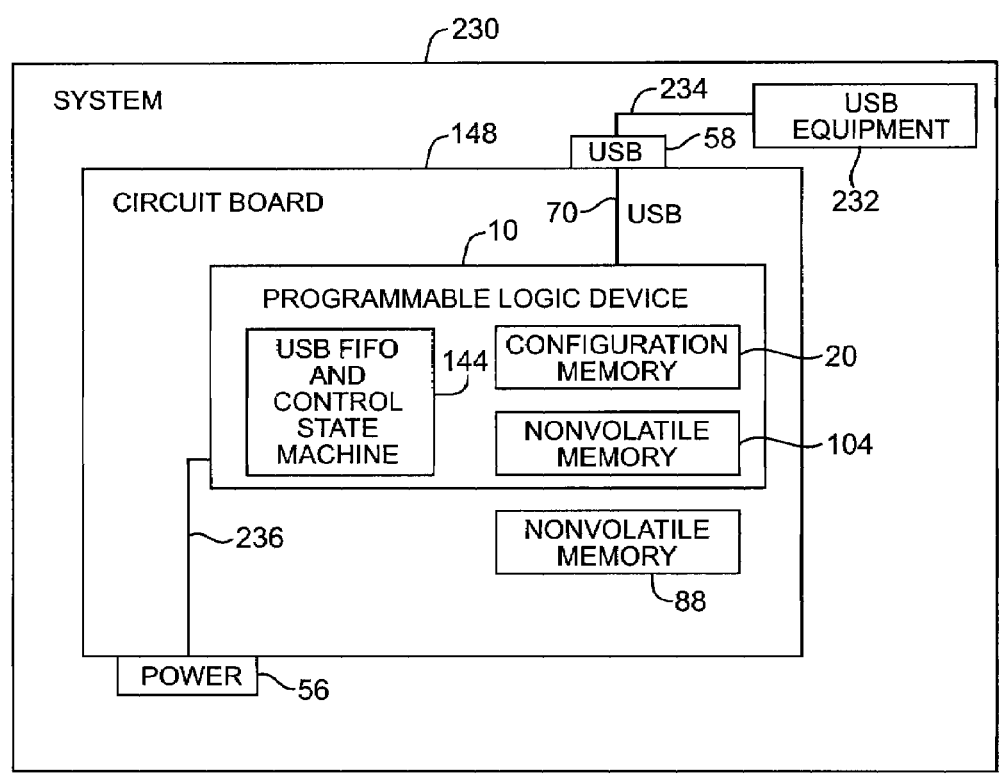
FIG. 15 is a diagram of an illustrative system in which a programmable logic device integrated circuit with universal serial bus capabilities may operate in user mode in accordance with the present invention.

A typical arrangement is shown in FIG. 15. System 230 includes one or more circuit boards such as circuit board 148 or other suitable mounting structures. Circuit board 148 includes one or more integrated circuits such as programmable logic device integrated circuit 10. Programmable logic device integrated circuit 10 contains USB FIFO and control state machine circuitry 144 that provides USB capabilities for supporting programming, testing, and user mode operations. During programming, configuration data is loaded into configuration memory 20 using an internal nonvolatile memory arrangement (nonvolatile memory 104), as described in connection with FIG. 8 or using an external nonvolatile memory arrangement (nonvolatile memory configuration device 88), as described in connection with FIG. 7.

Programmable logic device 10 has a USB port that is used during programming and testing. During user mode operations, user data signals pass through the USB port. In a typical arrangement of the type shown in FIG. 15, the USB pins of programmable logic device 10 are connected to a USB connector 58 mounted on circuit board 148 via a USB path 70. The USB path 70 includes a differential signaling path in which data signals are reference to each other, rather than to ground. The USB path 70 also typically includes ground and power lines. Power may be provided to programmable logic device 10 via power connector 56 and power path 236.

Connector 58 may be connected directly to board 148 or may be connected to board 148 through a circuit board mounting structure. USB-enabled equipment 232 such as computers and computer peripherals may be connected to circuit board 148 and programmable logic device during system operation. With a typical arrangement, USB equipment 232 is electrically connected to USB connector 58 using a universal serial bus cable 234 that is plugged into USB connector 58. Connector 58 of FIG. 15 may be the same connector that is used to connect programmable logic device 10 to automated test equipment 68 and computing equipment 206 during programming and testing operations.

Figure 16:
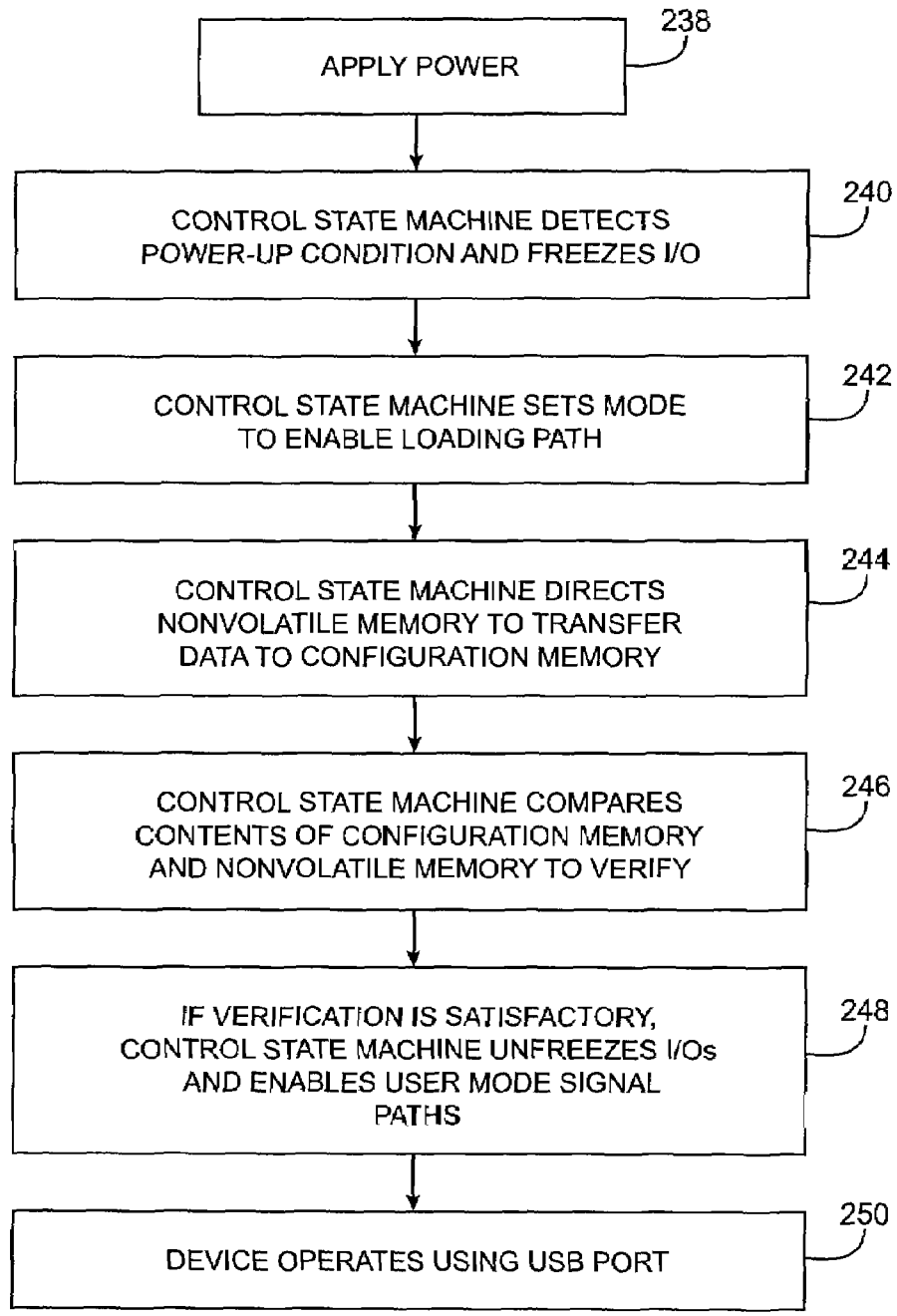
FIG. 16 is a flow chart of illustrative steps involved in using the programmable logic device with universal serial bus capabilities in a system of the type shown in FIG. 15 in accordance with the present invention.

Illustrative steps involved in using programmable logic device 10 in a system such as system 230 of FIG. 15 are shown in FIG. 16.

At step 238, the system powers up. A user might, for example, activate a switch that applies power to system circuits boards such as circuit board 148. Power may be distributed internally on each board using power supply and ground traces 236.

At step 240, the programmable logic device's control state machine 144 (FIG. 15) detects the power up condition and freezes the device's I/Os (see, e.g., I/Os 100 of FIG. 8).

At step 242, the control state machine 144 sets the device's operating mode to enable data loading. For example, a user mode parameter USER_MODE can be taken to 0. The USER_MODE signal can be applied to multiplexer 94 via path 108 of FIG. 8, to connect nonvolatile memory 104 to configuration memory 20 by enabling path 142.

At step 244, the control state machine 144 (control state machine 98 of FIG. 8) directs the nonvolatile memory 104 (FIG. 8) to transfer data from nonvolatile memory 104 to configuration memory 20 via path 142 and multiplexer 94. In external nonvolatile memory configurations, configuration data is loaded into configuration memory from external nonvolatile memory in the configuration device or other external circuitry.

At step 246, the control state machine compares the contents of the configuration memory 20 and the nonvolatile memory to determine whether the configuration data has been corrupted during the loading process.

If there is a discrepancy between the stored version of the configuration data and the data that has been loaded into the configuration memory, the configuration data loading process may be repeated. If the verification operation of step 246 is successful, the control state machine unfreezes I/Os 100 and places the device in user mode. The user mode parameter USER_MODE can be taken to 1 to disable path 142 of FIG. 8 and to enable path 112 of FIG. 8.

During step 250, the programmable logic device 10 operates normally and USB user data traffic flows through USB path 70 (FIG. 15). As shown in FIG. 8, path 112 carries USB data signals between core logic 96 and the USB FIFO 74 (USB FIFO and control state machine circuitry 144 of FIG. 15). The USB FIFO serves as an interface for USB traffic between path 112 (FIG. 8) and path 70 (FIG. 15). Input-output circuitry 100 (FIG. 8) serves as an interface between core logic 96 and external circuitry on board 148.

Programmable logic device integrated circuits with universal serial bus capabilities can benefit from native universal serial bus protocol support available in popular computer operating systems such as the Microsoft Windows operating system. The JTAG protocol is not supported by standard operating systems. With typical conventional schemes, a converter box is interposed between a testing computer and a JTAG-based programmable logic device to enable testing (e.g., programmable scan chain testing). A serial, parallel, or USB communications protocol is used between the testing computer and the converter box. Between the converter box and the programmable logic device, the JTAG protocol is used. This type of arrangement requires the installation of special drivers in the testing computer.

With a programmable logic device integrated circuit in accordance with the present invention, the universal serial bus protocol can be used exclusively. Testers, personal computers, and other computer-based equipment can communicate directly with the programmable logic device over a USB path without using a converter box. Because embedded protocol support is provided for the universal serial bus protocol in popular operating systems such as the Microsoft Windows operating system, it is not necessary to install special drivers on the testers, personal computers, or other computer-based equipment, provided that one of these popular operating systems is used. To further facilitate communications, operating systems can be updated to recognize the programmable logic device integrated circuit by using a device ID code. When a device 10 is connected to the USB port of a tester, personal computer, or other suitable equipment, the equipment can recognize the device 10 and can communicate with the device as if it were a removable disk (i.e., a universal serial bus memory drive).

Figure 17:
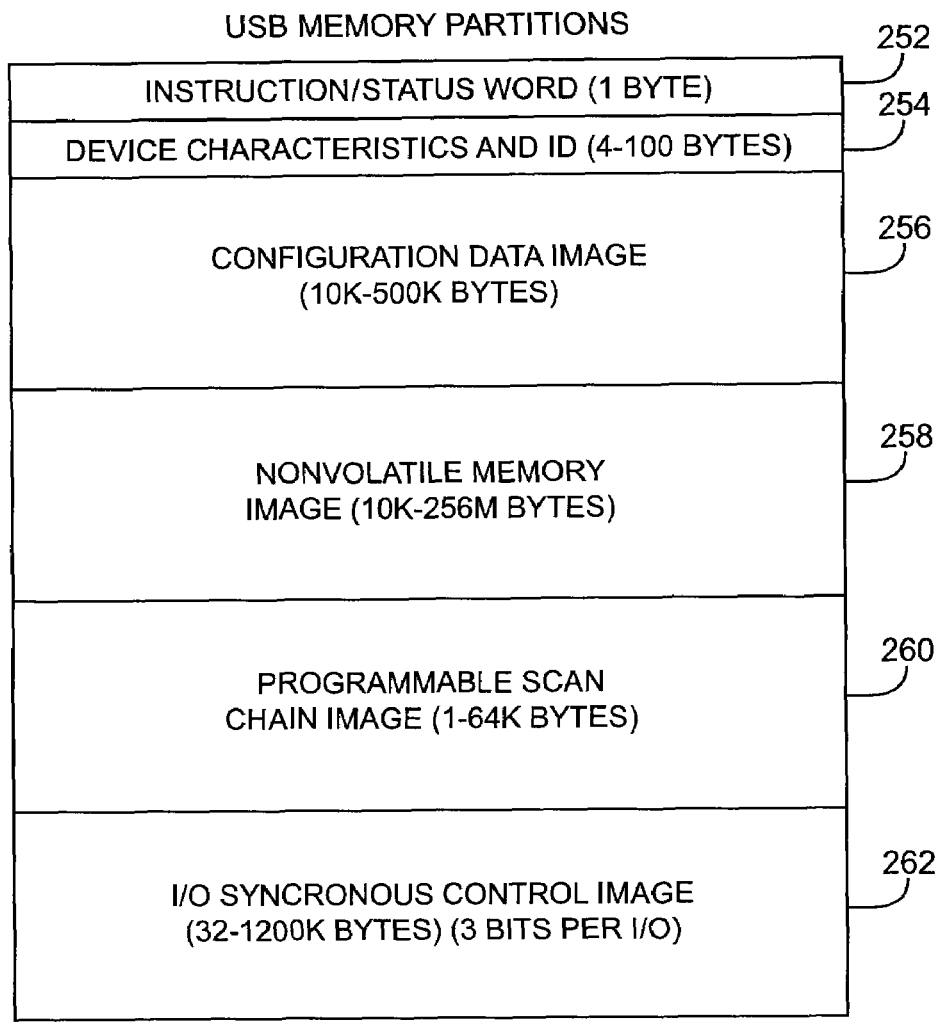
FIG. 17 is a diagram of an illustrative memory partition arrangement that may be used for a programmable logic device with universal serial bus capabilities in accordance with the present invention.

Illustrative memory partitions that may be used for a programmable logic device 10 that operates in this way are shown in FIG. 17. The partitions of FIG. 17 show memory address ranges that may be used in communicating with the device 10.

Memory addresses in the range specified by partition 252 may be used by device 10 to communicate status information to external equipment (e.g., status information such as hold, ready, etc.).

Partition 254 may be used to specify device characteristics such as manufacturer part number, software version for an operating system to use, etc.

The addresses of partition 256 may be use for direct writing or reading of configuration data to the configuration memory 20 in the core logic of the programmable logic device.

The addresses of partition 258 may be used to access the contents of the nonvolatile memory (e.g., internal nonvolatile memory 104 or external nonvolatile memory 88). This memory partition may be used in a user mode application. It may be read to and written from the USB port (step 45 of FIG. 3) and from the programmable logic core (step 49 of FIG. 3).

The address range specified by partition 260 may be used to read or write signals to the programmable scan chain such as chain 107 of FIG. 8 or chain 210 of FIG. 13.

The addresses of partition 262 may be used to load boundary scan test preload bits.

The sizes of the memory partitions in the example of FIG. 17 are merely illustrative. Any suitable memory partition arrangement and memory partition sizes may be used if desired.

The foregoing is merely illustrative of the principles of this invention and various modifications can be made by those skilled in the art without departing from the scope and spirit of the invention.

What is claimed is:

1. A programmable logic device integrated circuit that is programmed by programming equipment, comprising:
   configuration memory that is loaded with configuration data and that provides corresponding static control signals;
   programmable logic that is configured by the static control signals to implement a desired custom logic circuit; and
   differential communications circuitry that receives the configuration data from the programming equipment.

2. The programmable logic device integrated circuit defined in claim 1 further comprising nonvolatile memory connected to the differential communications circuitry, wherein the configuration data is stored in the nonvolatile memory and wherein the configuration memory is loaded with the configuration data stored in the nonvolatile memory.

3. The programmable logic device integrated circuit defined in claim 1, wherein an external integrated circuit with nonvolatile memory is connected to the programmable logic device integrated circuit, the programmable logic device integrated circuit further comprising input-output and interface circuitry connected between the differential communications circuitry and the external integrated circuit, wherein the configuration data is stored in the nonvolatile memory of the external integrated circuit by the input-output and interface circuitry and wherein the configuration memory is loaded with the configuration data stored in the nonvolatile memory using the input-output and interface circuitry.

4. The programmable logic device integrated circuit defined in claim 1 wherein the differential communications circuitry comprises universal serial bus circuitry that handles user data traffic.

5. The programmable logic device integrated circuit defined in claim 1 wherein the differential communications circuitry comprises universal serial bus circuitry and control state machine circuitry that contains an instruction decoder responsive to a command to initiate operations to capture test data.

6. The programmable logic device integrated circuit defined in claim 1 wherein the differential communications circuitry comprises universal serial bus circuitry and control state machine circuitry that is responsive to a command to place the programmable logic device in a boundary scan mode.

7. A method for using equipment to program a programmable logic device integrated circuit that contains configuration memory, programmable logic, and differential communications circuitry, comprising:
  receiving configuration data from the equipment using the differential communications circuitry;
  using the differential communications circuitry in storing the configuration data; and
  loading the stored configuration data into the configuration memory so that the configuration memory provides static control signals that configure the programmable logic to implement a desired custom logic function.

8. The method defined in claim 7 wherein the programmable logic device integrated circuit contains nonvolatile memory, the method further comprising:
  using the differential communications circuitry to write data to and read data from the nonvolatile memory element without using the programmable logic.

9. The method defined in claim 7 wherein the programmable logic device integrated circuit contains nonvolatile memory, the method further comprising:
  using the differential communications circuitry to store the configuration data in the nonvolatile memory, wherein loading the stored configuration data further comprises transferring the stored configuration data from the nonvolatile memory to the configuration memory.

10. The method defined in claim 7 wherein the programmable logic device integrated circuit is connected to an integrated circuit that contains nonvolatile memory using a path, wherein using the differential communications circuitry in storing the configuration data comprises providing the configuration data to the nonvolatile memory using the path, and wherein loading the configuration memory comprises transferring the configuration data to the configuration memory using the path.

11. The method defined in claim 7 wherein using the differential communications circuitry in storing the configuration data comprises using the differential communications circuitry in storing the configuration data in nonvolatile memory and wherein the differential communications circuitry includes universal serial bus and control state machine circuitry that receives a universal serial bus packet that instructs the universal serial bus and control state machine circuitry to turn on high voltage circuitry in the nonvolatile memory to enable the configuration data to be stored in the nonvolatile memory.

12. The method defined in claim 7 wherein the differential communications circuitry comprises clock recovery circuitry, the method further comprising:
  receiving configuration data using the differential communications circuitry; and
  extracting an embedded clock signal from the received configuration data using the clock recovery circuitry.

* * * * *